United States Patent
Asayama (10) Patent No.: US 8,737,118 B2
(45) Date of Patent: May 27, 2014

(54) SEMICONDUCTOR MEMORY DEVICE AND TEST METHOD THEREFOR

(75) Inventor: Shinobu Asayama, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/608,185

(22) Filed: Sep. 10, 2012

(65) Prior Publication Data

US 2013/0003444 A1 Jan. 3, 2013

Related U.S. Application Data

(63) Continuation of application No. 12/696,608, filed on Jan. 29, 2010, now Pat. No. 8,284,591.

(30) Foreign Application Priority Data

Feb. 27, 2009 (JP) .................................. 2009-045330

(51) Int. Cl.
*G11C 29/00* (2006.01)
*G11C 11/413* (2006.01)

(52) U.S. Cl.
USPC ......................................................... 365/154

(58) Field of Classification Search
None
See application file for complete search history.

(56) References Cited

U.S. PATENT DOCUMENTS

| 5,612,919 | A | 3/1997 | Arimoto | |
|---|---|---|---|---|
| 5,894,445 | A * | 4/1999 | Kobayashi | 365/208 |
| 5,926,422 | A * | 7/1999 | Haukness | 365/201 |
| 6,680,861 | B2 | 1/2004 | Kasai | |
| 7,286,426 | B2 * | 10/2007 | Nagami et al. | 365/205 |
| 7,463,508 | B2 | 12/2008 | Pineda De Gyvez et al. | |
| 7,864,612 | B2 | 1/2011 | Lusky et al. | |
| 2002/0018359 | A1 * | 2/2002 | Mizuno et al. | 365/154 |
| 2008/0186784 | A1 | 8/2008 | Eby et al. | |

FOREIGN PATENT DOCUMENTS

| JP | 8-195100 A | 7/1996 |
|---|---|---|
| JP | 10-308100 A | 11/1998 |
| JP | 11-353898 A | 12/1999 |
| JP | 2003-109377 A | 4/2003 |
| JP | 2006-219177 A | 8/2006 |
| JP | 2007-102902 A | 4/2007 |
| JP | 2008-522334 A | 6/2008 |
| WO | WO 2008/072354 A1 | 6/2008 |

* cited by examiner

Primary Examiner — Hoai V Ho
Assistant Examiner — James G Norman
(74) Attorney, Agent, or Firm — Foley & Lardner LLP (57) ABSTRACT

Provided is a semiconductor memory device including: first and second SRAM cells; a first hit line pair provided with the first SRAM cell; a second bit line pair provided with the second SRAM cell; a first switch circuit provided between the first bit line pair and the second bit line pair; and a controller that controls the first switch circuit to render the first bit line pair and the second bit line pair conductive, in a case of testing the first SRAM cell.

10 Claims, 12 Drawing Sheets

SEMICONDUCTOR MEMORY DEVICE AND TEST METHOD THEREFOR

INCORPORATION BY REFERENCE

This application is based upon and claims the benefit of priority from Japanese patent application No. 2009-045330, filed on Feb. 27, 2009, the disclosure of which is incorporated herein in its entirety by reference.

BACKGROUND

1. Field of the Invention

The present invention relates to a semiconductor memory device and a test method therefor, and more particularly, to a static random access memory (SRAM) and a test method therefor.

2. Description of Related Art

The recent miniaturization of static random access memories (SRAMs) has made it more difficult to secure their operation margin. As disclosed in Japanese Unexamined Patent Application Publication No. 2007-102902 and Published Japanese Translation of PCT International Publication for patent application, No. 2008-522334 (PCT Application WO 2006/056902), the operation margin of SRAMs is generally evaluated using static noise margin (SNM). In contrast to the SNM, dynamic noise margin (DNM) is known as an operation margin reflecting more actual operations.

Incidentally, in view of high speed operations and an improvement in the resistance of SRAMs to noise, the number of memory cells, i.e., the number of rows provided for each bit line pair tends to decrease. At present, it is considered that the number of rows is suitably in the range of about 8 to 32.

As a related art of the present invention, Japanese Unexamined Patent Application Publication No. 10-308100 discloses a method for testing an operation margin in a dynamic random access memory (DRAM). In addition, Japanese Unexamined Patent Application Publication No. 11-353898 discloses a method for testing an operation margin in a ferroelectric random access memory (FRAM).

Figure 12:
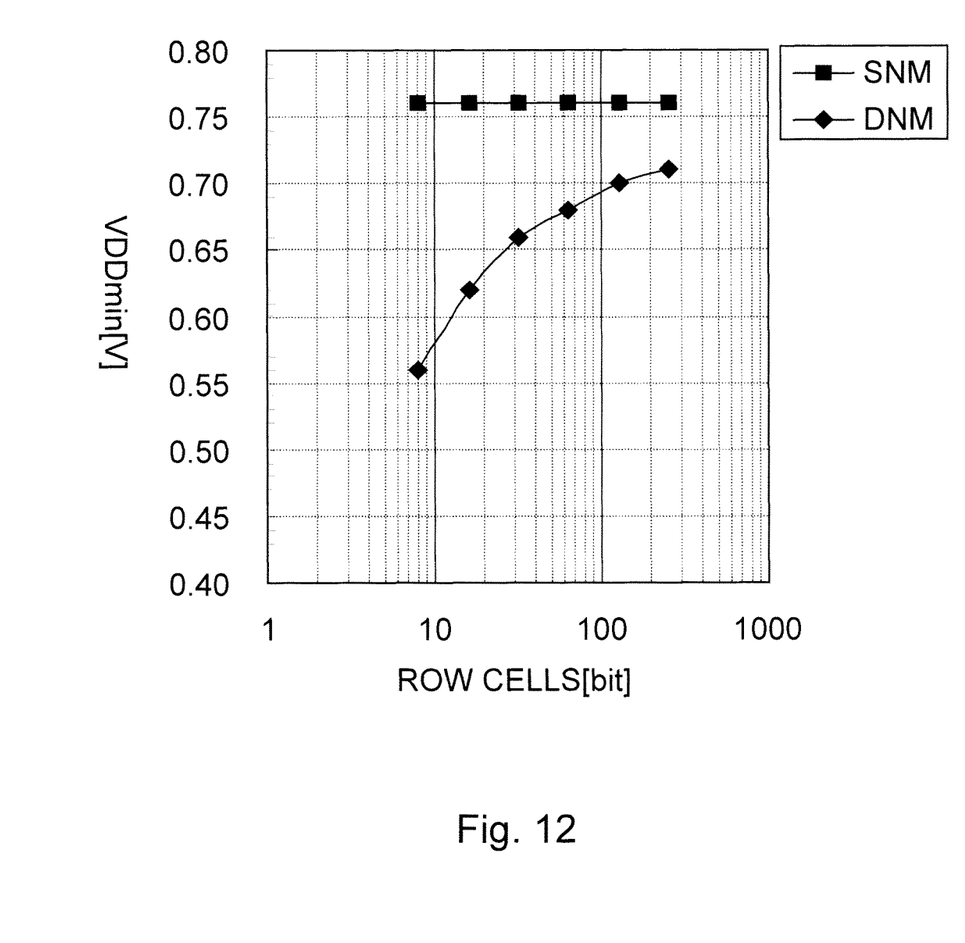
FIG. 12 is a graph illustrating a change in noise margin with respect to the number of rows of memory cells of a 40 nm SRAM.

Referring now to FIG. 12 which is a graph illustrating a change in noise margin with respect to the number of rows of memory cells of a 40 nm SRAM. The horizontal axis represents, in units of bits, the number of memory cells, i.e., row cells connected to each bit line pair. The longitudinal axis represents, in units of volt (V), a minimum operating voltage (VDDmin) for a memory cell serving as an index of a noise margin. A voltage equal to or higher than VDDmin is required to retain data.

Specifically, the SNM and DNM at six points where the number of rows=8, 16, 32, 64, 128, and 256 bits are plotted. As shown in FIG. 12, the SNM which is a static evaluation value is constant with respect to the number of rows. Meanwhile, the DNM is a dynamic evaluation value which rapidly decreases as the number of rows decreases, resulting in an increase in deviation from the SNM.

SUMMARY

The evaluation of the operation margin using the SNM is suitable as long as the number of rows is large and the deviation between the SNM and DNM is small as in the conventional case. However, when the number of rows is reduced, as described above, the deviation between the SNM and DNM increases. Accordingly, the evaluation of the operation margin using the SNM has a problem in that the operation margin becomes excessively large and the yield is considerably lowered. In other words, if the operation margin can be evaluated appropriately by using the DNM, the yield, i.e., the productivity of high-speed SRAMs can be improved.

A first exemplary aspect of the present invention is a semiconductor memory device including: a first SRAM cell and a second SRAM cell; a first bit line pair provided with the first SRAM cell; a second bit line pair provided with the second SRAM cell; a first switch circuit provided between the first bit line pair and the second bit line pair; and a controller that controls the first switch circuit to render the first bit line pair and the second bit line pair conductive, in a case of testing the first SRAM cell.

A second exemplary aspect of the present invention is a test method for a semiconductor memory device, the semiconductor memory device including: a first bit line pair provided with a first SRAM cell; and a second bit line pair provided with a second SRAM cell, the test method including: in a case of testing the first SRAM cell, rendering the first bit line pair and the second bit line pair conductive at a first timing; and performing a read operation for the first SRAM cell at a second timing subsequent to the first timing.

The provision of the controller that controls the first switch circuit to render the first bit line pair and the second bit line pair conductive, in the case of testing the first SRAM cell, makes it possible to provide a semiconductor memory device which is capable of evaluating the operation margin simply by using the DNM and is excellent in the productivity based on the DNM evaluation.

According to an exemplary aspect of the present invention, it is possible to provide a semiconductor memory device excellent in the productivity based on the evaluation of the operation margin using the DNM.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Exemplary embodiments of the present invention will be described in detail below with reference to the accompanying drawings. Note that the present invention is not limited to exemplary embodiments described below. The following descriptions and drawings are simplified as appropriate to clarify the explanation.

[First Exemplary Embodiment]

Figure 1:
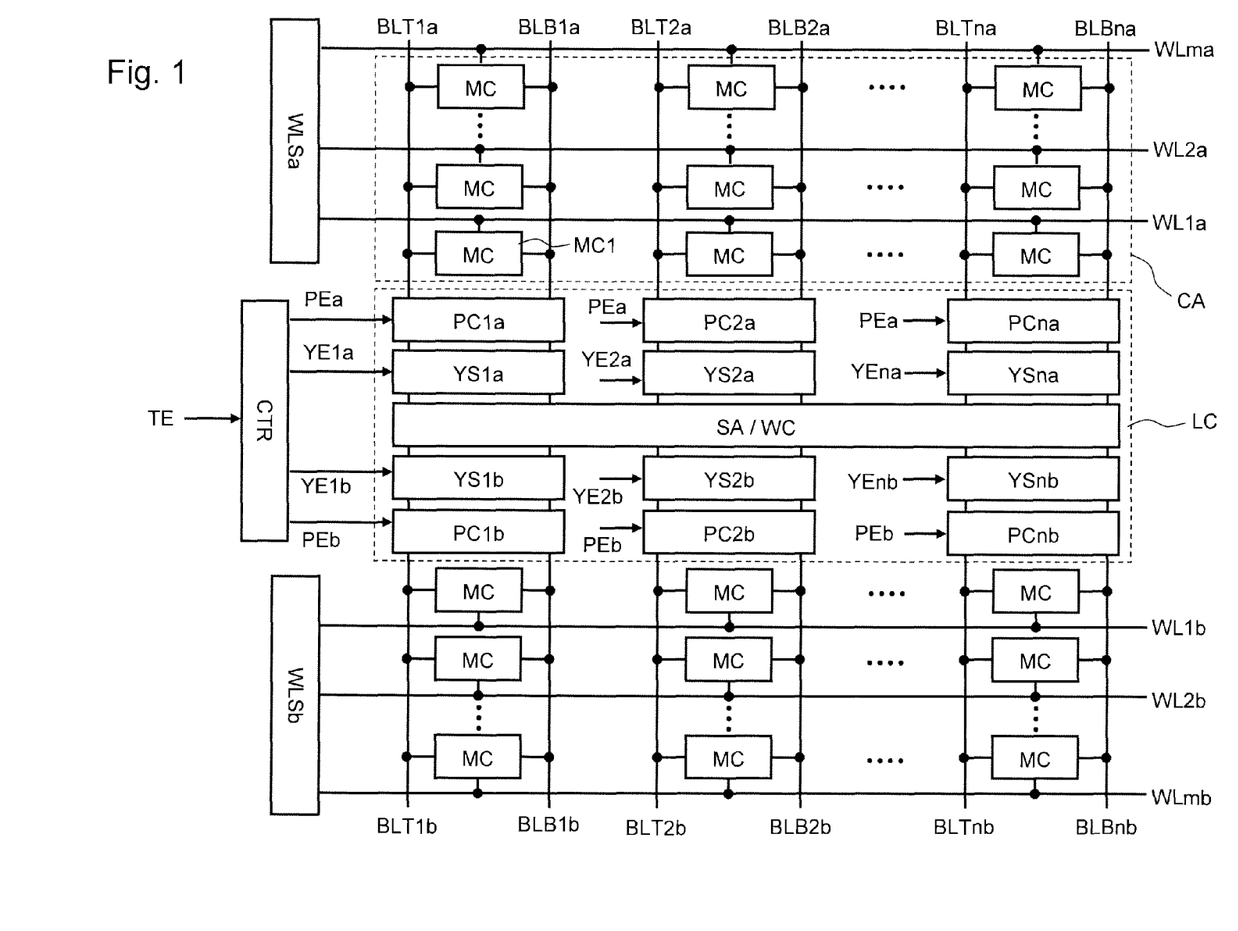
FIG. 1 is a circuit diagram illustrating a semiconductor memory device according to a first exemplary embodiment of the present invention.

FIG. 1 is a circuit diagram illustrating a semiconductor memory device according to a first exemplary embodiment of the present invention. The semiconductor memory device is an SRAM. The semiconductor memory device includes a control circuit CTR, a sense amplifier SA, a write circuit WC, n (n is a natural number) pairs of Y selectors YS1a to YSna and YS1b to YSnh, n pairs of precharge circuits PC1a to PCna and PC1b to PCnb, 2n pairs of bit lines BLT1a and BLB1a to BLTna and BLBna, and BLT1b and BLB1b to BLTnb and BLBnb, a pair of word line selectors WLSa and WLSb, m (m is a natural number) pairs of word lines WL1a to WLma and WL1b to WLmb, and n×m pairs of memory cells MC. The sense amplifier and write circuit SA/WC includes the sense amplifier SA and the write circuit WC which are integrally illustrated in FIG. 1 for convenience of illustration. The sense amplifier SA is a circuit that amplifies a potential difference between two sense nodes of a memory cell MC selected in a read operation. In the case of a memory cell MC1, for example, the sense nodes herein described refer to nodes at which the memory cell MC1 is connected with the bit line pair BLT1a and BLB1a. The write circuit WC is a circuit that writes data to the selected memory cell MC in a write operation. That is, the sense amplifier SA and the write circuit WC complementarily operate at different timings.

The sense amplifier and write circuit SA/WC is connected with the n pairs of Y selectors YS1a to YSna and YS1b to YSnb. Each of the Y selectors is connected with a bit line pair including two bit lines. For example, the Y selector YS1a is connected with the bit line pair BLT1a and BLB1a.

As shown in FIG. 1, the Y selectors YS1a to YSna switch electrical connection states between the sense amplifier and write circuit SA/WC and the bit line pairs BLT1a and BLB1a to BLTna and BLBna based on selection signals YE1a to YEna, respectively. Similarly, the Y selectors YS to YSnb switch electrical connection states between the sense amplifier and write circuit SA/WC and the bit line pairs BLT1b and BLB1b to BLTnb and BLBnb based on selection signals YE1b to YEnb, respectively.

As shown in FIG. 1, the Y selectors YS1a to YSna are connected with the precharge circuits PC1a to PCna, respectively. The precharge circuits PC1a to PCna precharge the bit line pairs BLT1a and BLB1a to BLTna and BLBna, respectively, based on a precharge signal PEa. Similarly, the Y selectors YS1b to YSnb are connected with the precharge circuits PC1b to PCnb, respectively. The precharge circuits PC1b to PCnb precharge the bit line pairs BLT1b and BLB1b to BLTnb and BLBnb, respectively, based on a precharge signal PEb.

As shown in FIG. 1, the sense amplifier and write circuit SA/WC, the Y selectors YS1a to YSna and YS1b to YSnb, and the precharge circuits PCa to PCna and PC to PCnb constitute a local circuit LC.

The control circuit CTR is a circuit that controls the Y selectors YS1a to YSna and YS1b to YSnb and the precharge circuits PC1a to PCna and PC to PCnb. The selection signals YE1a to YEna and YE1b to YEnb and the precharge signals PEa and PEb are generated based on a test signal TE.

As shown in FIG. 1, the m number of word lines WL1a to WLma are disposed substantially orthogonal to the n pairs of bit lines BLT1a and BLB1a to BLTna and BLBna. The word lines WL1a to WLma are each connected to the word line selector WLSa. Similarly, the m number of word lines WL1b to WLmb are disposed substantially orthogonal to the n pairs of bit lines BLT1b and BLB1b to BLTnb and BLBnb.

The n pairs of bit lines BLT1a and BLB1a to BLTna and BLBna are connected with m number of memory cells MC, each of which is connected with the m number of word lines WL1a to WLma. That is, the n×m number of memory cells MC are disposed at intersections of the n pairs of bit lines BLT1a and BLB1a to BLTna and BLBna and the m number of word lines WL1a to WLma. The n×m number of memory cells MC constitute a cell array CA. Herein, "m" represents the number of memory cells, i.e., row cells connected to each bit line pair.

Similarly, the n pairs of bit lines BLT1b and BLB1b to BLTnb and BLBnb are connected with m number of memory cells MC, each of which is connected with the m number of word lines WL1b to WLmb. That is, the n×m number of memory cells MC are disposed at intersections of the n pairs of bit lines BLT1b and BLB1b to BLTnb and BLBnb and the m number of word lines WL1b to WLmb.

Figure 2:
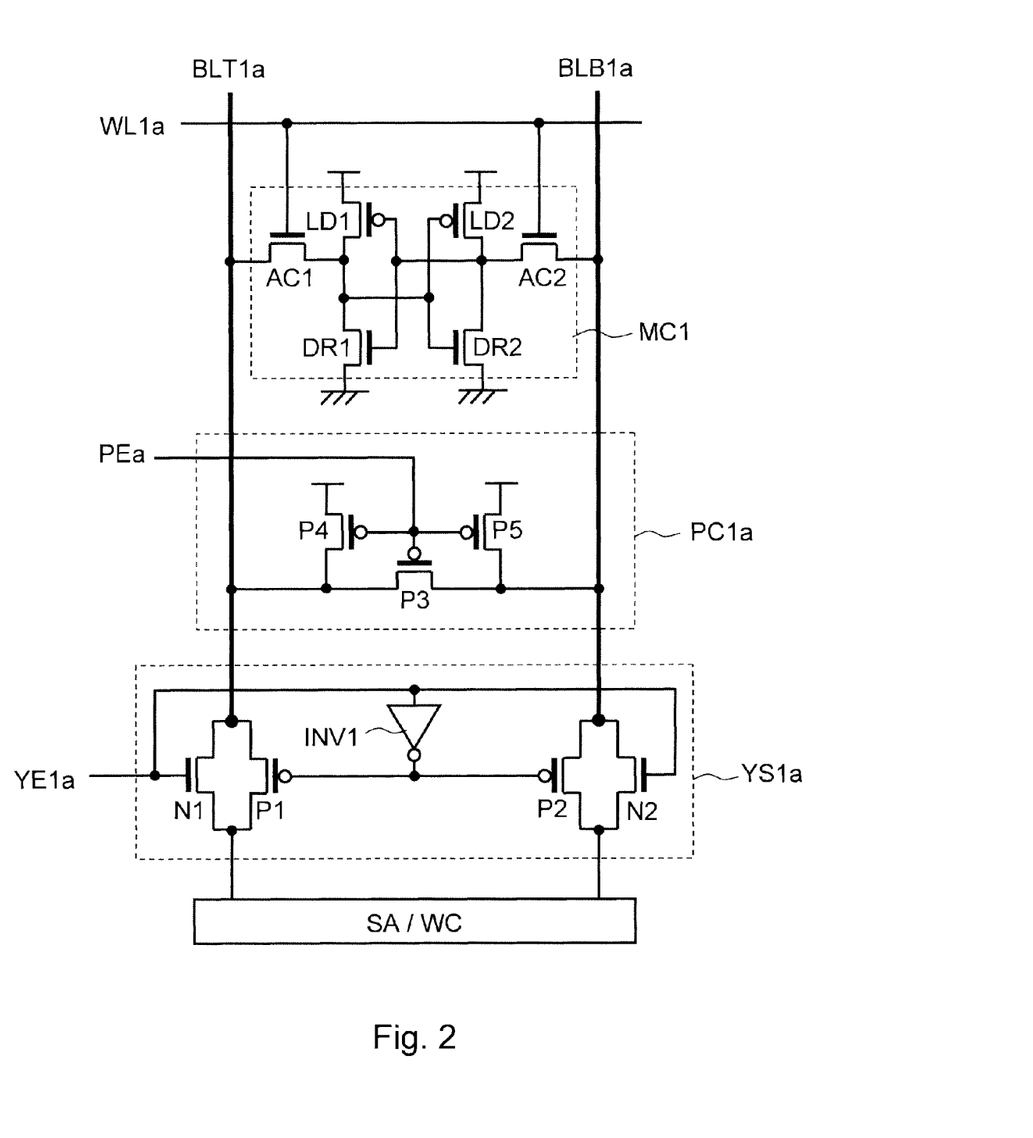
FIG. 2 is a detailed circuit diagram illustrating a part of the semiconductor memory device shown in FIG. 1.

FIG. 2 is a detailed circuit diagram illustrating a part of the SRAM shown in FIG. 1. FIG. 2 shows the circuit configurations of the Y selector YS1a, the bit line pair BLT1a and BLB1a, the precharge circuit PC1a, and the memory cell MC1, which are illustrated in FIG. 1. Referring to FIG. 2, the bit line pair BLT1a and BLB1a is indicated by boldface.

The Y selector YS1a is a switch circuit which includes two PMOS transistors P1 and P2, two NMOS transistors N1 and N2, and an inverter INV1. One of the source and drain of each of the PMOS transistor P1 and the NMOS transistor N1 is connected to the sense amplifier and write circuit SA/WC, and the other of the source and drain of each of the PMOS transistor P1 and the NMOS transistor N1 is connected to the bit line BLT1a. Similarly, one of the source and drain of each of the PMOS transistor P2 and the NMOS transistor N2 is connected to the sense amplifier and write circuit SA/WC, and the other of the source and drain of each of the PMOS transistor P2 and the NMOS transistor N2 is connected to the bit line BLB1a.

The gates of the PMOS transistors P1 and P2 receive the selection signal YE1a through the inverter INV1. The gates of the NMOS transistors N1 and N2 directly receive the selection signal YE1a. When the selection signal YE1a is at "H" (high) level, all the four transistors are turned on. Meanwhile, when the selection signal YE1a is at "L" (low) level, all the four transistors are turned off.

The precharge circuit PC1a includes three PMOS transistors P3 to P5. The sources of the PMOS transistors P4 and P5 are connected to a power supply (power supply voltage VDD). The drain of the PMOS transistor P4 and one of the source and drain of the PMOS transistor P3 are connected to the bit line BLT1a. The drain of the PMOS transistor P5 and the other of the source and drain of the PMOS transistor P3 are connected to the bit line BLB1a.

The gates of the PMOS transistors P3 to P5 receive the precharge signal PEa. When the precharge signal PEa is at the "L" level, the PMOS transistors P3 to P5 are turned on and the bit line pair BLT1a and BLB1a is precharged with the power supply voltage VDD. Meanwhile, when the precharge signal PEa is at the "H" level, the PMOS transistors P3 to P5 are turned off.

The memory cell MC1 includes six MOS transistors: two load transistors LD1 and LD2 which are PMOS transistors, two drive transistors DR1 and DR2 which are NMOS transistors, and two selection transistors AC1 and AC2 which are NMOS transistors. The load transistor LD1 and the drive transistor DR1 constitute an inverter. Similarly, the load transistor LD2 and the drive transistor DR2 also constitute an inverter.

The sources of the load transistors LD1 and LD2 are connected to the power supply (power supply voltage VDD). The drains of the load transistors LD1 and LD2 are connected to the drains of the drive transistors DR1 and DR2, respectively. The sources of the drive transistors DR1 and DR2 are grounded. The gates of the load transistor LD1 and the drive transistor DR1 are connected to a node at which the drains of the load transistor LD2 and the drive transistor DR2 are connected to each other. The gates of the load transistor LD2 and the drive transistor DR2 are connected to a node at which the drains of the load transistor LD1 and the drive transistor DR1 are connected to each other.

One of the source and drain of the selection transistor AC1 is connected to a node at which the drains of the load transistor LD1 and the drive transistor DR1 are connected to each other. The other of the source and drain of the selection transistor AC1 is connected to the bit line BLT1a. One of the source and drain of the selection transistor AC2 is connected to the node at which the drains of the load transistor LD2 and the drive transistor DR2 are connected to each other. The other of the source and drain of the selection transistor AC2 is connected to the bit line BLB1a. The gates of the selection transistors AC1 and AC2 are connected to the word line WL1a.

Figure 3:
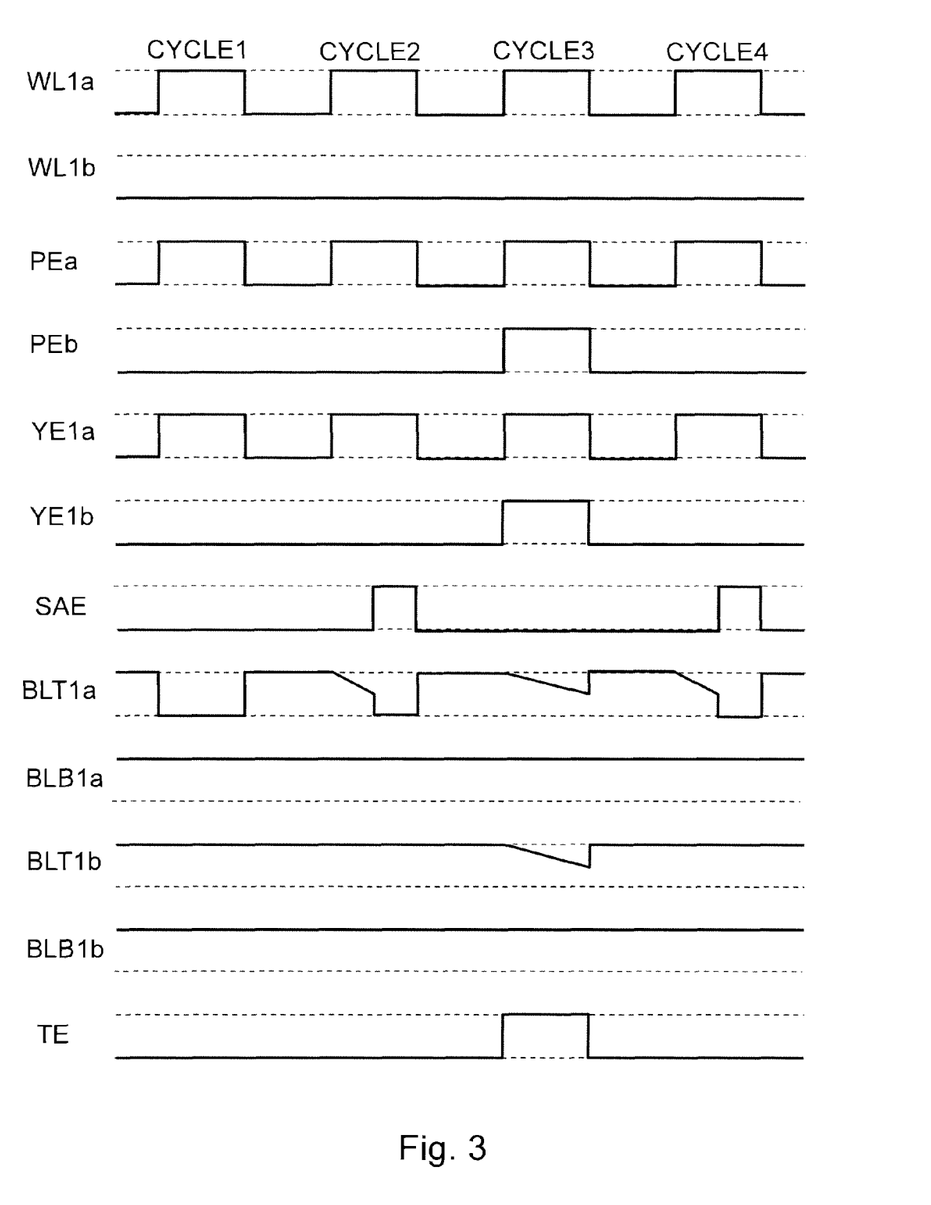
FIG. 3 is a timing diagram illustrating a test operation according to the first exemplary embodiment.

Referring next to FIGS. 3 to 6, a test operation of the semiconductor memory device according to this exemplary embodiment will be described. FIG. 3 is a timing diagram illustrating the test operation according to the first exemplary embodiment. As shown in FIG. 3, a cycle 1 corresponds to a normal write operation period. During this period, the signal level of the word line WL1a becomes the "H" level, and the memory cell MC1 shown in FIG. 1 is selected. Further, since the selection signal YE1a is at the "H" level, the memory cell MC1 and the sense amplifier and write circuit SA/WC are rendered conductive through the bit line pair BLT1a and BLB1a. Meanwhile, since the precharge signal PEa is at the "H" level, the bit line pair BLT1a and BLB1a is not precharged.

Figure 4A:
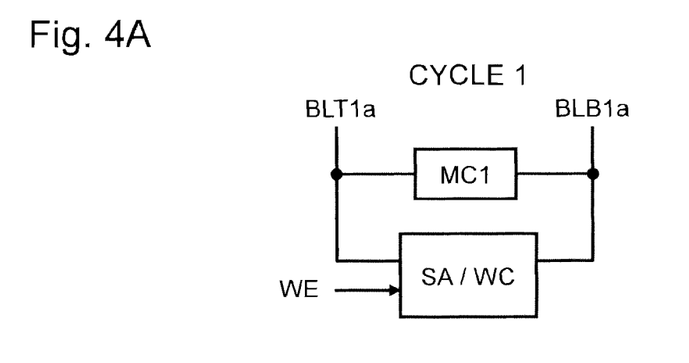
FIG. 4A is a diagram schematically illustrating a connection state in a cycle 1 shown in FIG. 3.

FIG. 4A is a diagram schematically illustrating a connection state in the cycle 1 shown in FIG. 3. A write signal WE is input to the write circuit WC so as to activate the write circuit WC. As a result, data is written to the memory cell MC1. In the case of FIG. 3, "L" is written to the node on the bit line BLT1a side of the memory cell MC1 and "H" is written to the node on the bit line BLB1a side of the memory cell MC1.

Referring to FIG. 3, each period between adjacent cycles is a precharge period. During this period, the precharge signal PEa is at the "L" level, and the bit line pair BLT1a and BLB1a is precharged to the "H" signal level. Note that the signal level of the word line WL1a and the selection signal YE1a become the "L" level, and the memory cell MC1 and the sense amplifier and write circuit SA/WC are rendered non-conductive with the bit line pair BLT1a and BLB1a.

A cycle 2 shown in FIG. 3 corresponds to a normal read operation period. During this period, the signal level of the word line WL1a and the selection signal YE1a become the "H" level, and the memory cell MC1 and the sense amplifier and write circuit SA/WC are rendered conductive through the bit line pair BLT1a and BLB1a. In this case, the signal level at the node on the bit line BLT1a side of the memory cell MC1 is maintained at the "L" level. Accordingly, in the cycle 2, the potential of the bit line BLT1a gradually decreases from the "H" level due to the precharge. After the elapse of a predetermined period of time in the cycle 2, a sense signal SAE is switched from the "L" level to the "H" level, to thereby activate the sense amplifier SA. As a result, the signal level of the bit line BLT1a drops to the "L" level.

Figure 4B:
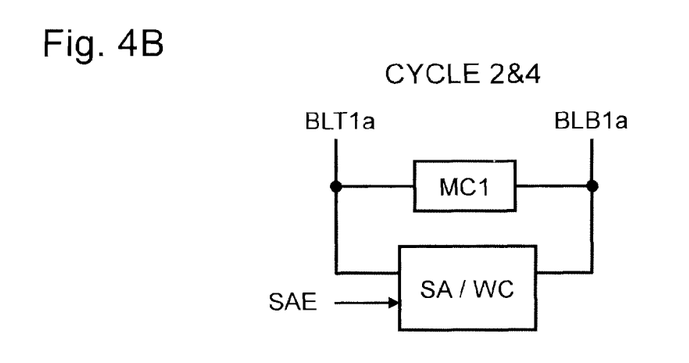
FIG. 4B is a diagram schematically illustrating a connection state in cycles 2 and 4 shown in FIG. 3.

FIG. 4B is a diagram schematically illustrating a connection state in cycles 2 and 4 shown in FIG. 3. The sense signal SAE is input to the sense amplifier SA so as to activate the sense amplifier SA. As a result, data is read from the memory cell MC1.

A cycle 3 shown in FIG. 3 corresponds to a noise addition period. During this period, the test signal TE changes from the "L" level to the "H" level. Further, the signal level of the word line WL1a and the selection signal YE1a become the "H" level, and the memory cell MC1 and the sense amplifier and write circuit SA/WC are rendered conductive through the bit line pair BLT1a and BLB1a. Furthermore, the selection signal YE1b becomes the "H" level, and the memory cell MC1 is also connected to the bit line pair BLT1b and BLB1b.

Note that only during the period of the cycle 3, the precharge signal PEb becomes the "H" level and the bit line pair BLT1b and BLB1b is not precharged. In the cycle 3, the sense amplifier SA is not activated, and the read operation, i.e., determination is not performed. In this case, after the sense amplifier SA is activated at the same timing as the cycle 2, the bit line pair BLT1a and BLB1a or the word line WL1a may be non-selected to omit the determination.

In this case, the signal level at the node on the bit line BLT1a side of the memory cell MC1 is maintained at the "L" level. Accordingly, in the cycle 3, the potential of the bit line BLT1a gradually decreases from the "H" level due to the precharge. Because the bit line BLT1b is electrically connected with the hit line BLT1a, the potential of the bit line BLT1b also decreases. In the cycle 3, the load of the bit line pair BLT1a and BLB1a as well as the load of the bit line pair BLT1b and BLB1b, i.e., a double load is applied to the memory cell MC1. For this reason, if the DNM of the memory cell MC1 is insufficient, the data is overwritten. Note that the bit line load can be increased by, for example, rendering a bit line pair BLT2b and BLB2b conductive to triple the hit line load to be applied to the memory cell MC1.

Figure 4C:
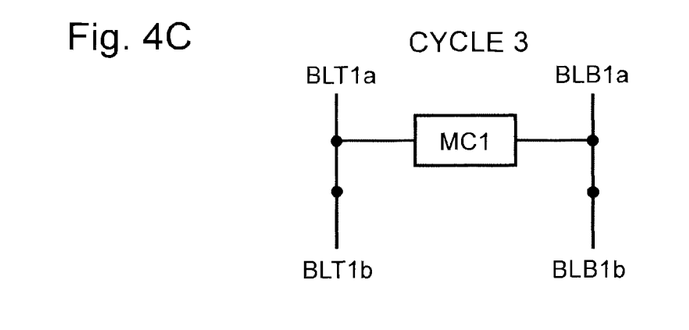
FIG. 4C is a diagram schematically illustrating a connection state in a cycle 3 shown in FIG. 3.

FIG. 4C is a diagram schematically illustrating a connection state in the cycle 3 shown in FIG. 3. The memory cell MC1 is connected not only to the bit line pair BLT1a and BLB1a but also to the bit line pair BLT and BLB1b.

The cycle 4 shown in FIG. 3 corresponds to the normal read operation period. The operation is similar to that in the cycle 2, so the description thereof is omitted. In this case, if the DNM of the memory cell MC1 is insufficient, the data is overwritten in the cycle 3. Accordingly, a DNM deficiency can be determined.

Figure 5:
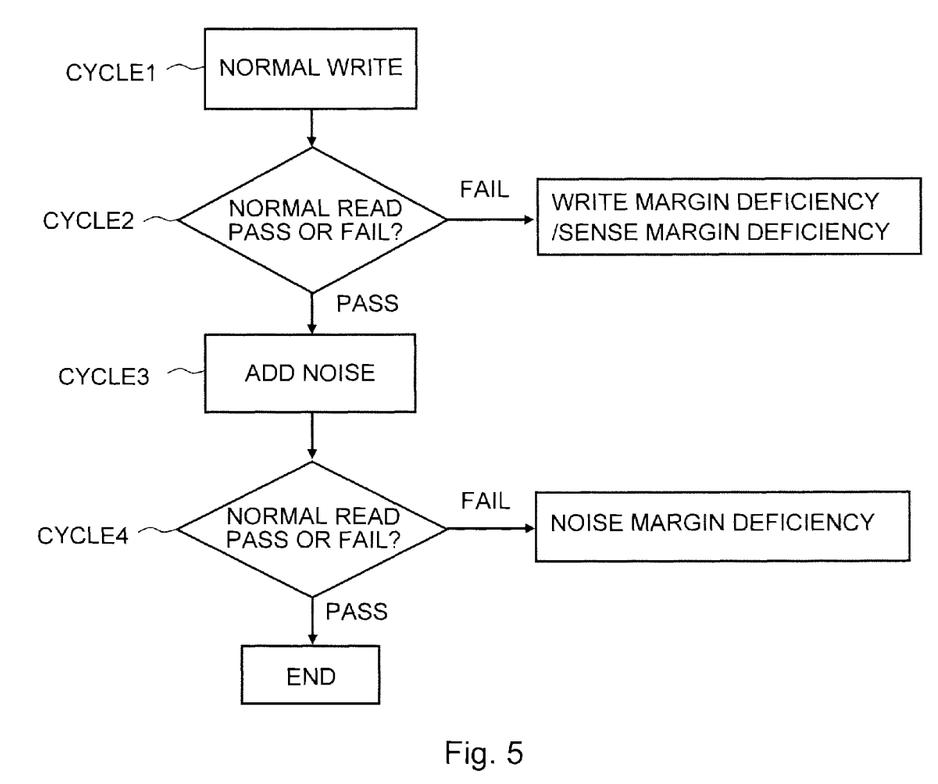
FIG. 5 is a flowchart showing the test operation according to the first exemplary embodiment.

FIG. 5 is a flowchart showing the test operation according to the first exemplary embodiment. As described above with reference to FIG. 3, the normal write operation is first carried out in the cycle 1. The normal read operation is then carried out in the cycle 2. Here, PASS or FAIL is determined. In the case of FAIL, a write margin deficiency or a sense margin deficiency is determined. In the case of PASS in the cycle 2, noise is added in the cycle 3. Then, the normal read operation is carried out in the cycle 4. Here, PASS or FAIL is determined. In the case of FAIL, the DNM deficiency is determined. This DNM test method enables discrimination between FAIL due to the DNM deficiency and FAIL due to other causes.

Specifically, for example, as shown in FIG. 12, in the case of an SRAM having 16 row cells, VDDmin=0.62 V. When bit line loads of 32 row cells are applied to the SRAM having 16 row cells, VDDmin=0.66 V. Accordingly, this test method enables screening of the noise margin in the case where 0.04 V=40 mV. As a matter of course, a larger noise margin can be screened by increasing the hit line load to be applied in the cycle 3. That is, the bit line load to be applied in the cycle 3 may be appropriately determined based on the required DNM.

Figure 6:
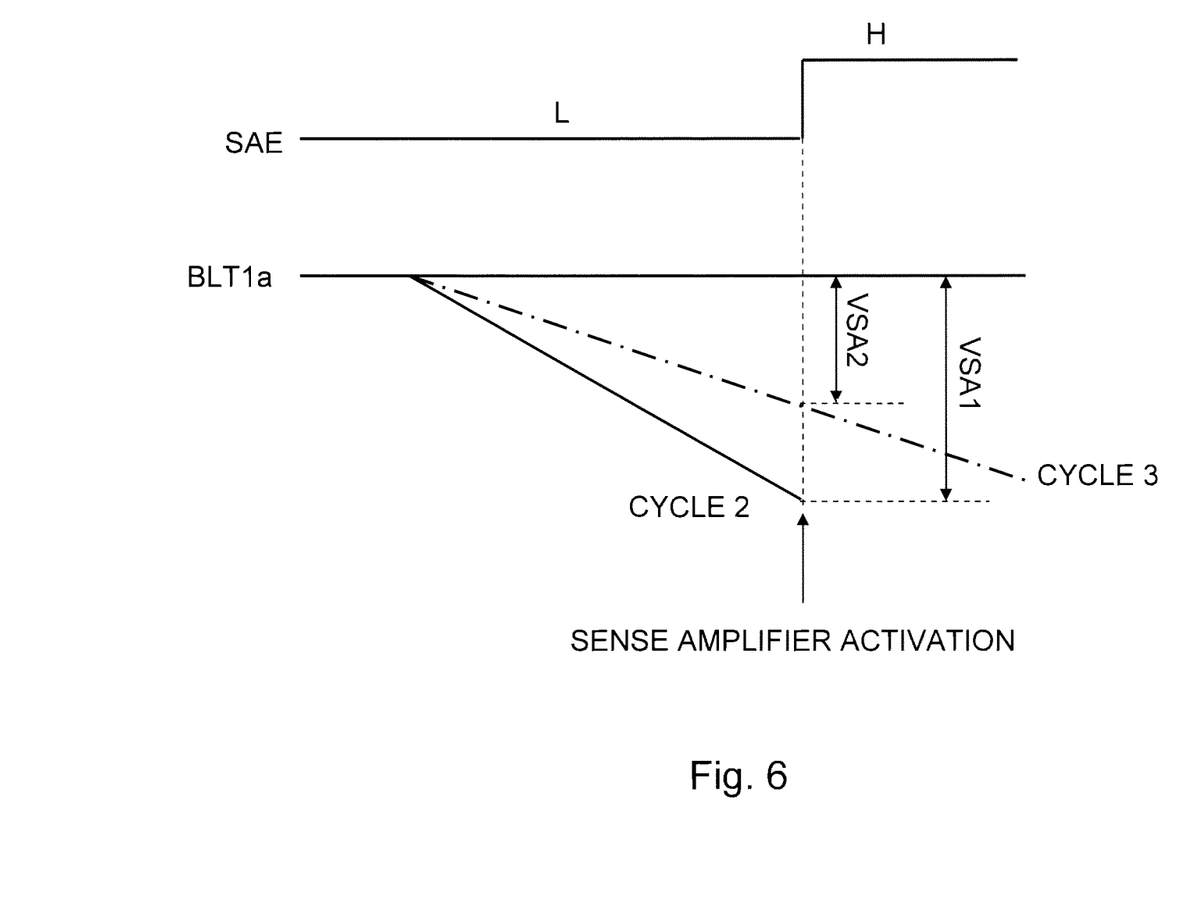
FIG. 6 is a graph illustrating, in a superimposed manner, a potential drop of a bit line BLT1a in the cycle 2 and a potential drop of the bit line BLT1a in the cycle 3, which are shown in the timing diagram of FIG. 3.

Referring next to FIG. 6, a description is given of the reason why only the noise addition is performed in the cycle 3 and the read operation, i.e., determination is not performed in the cycle 3. FIG. 6 is a graph illustrating, in a superimposed manner, a potential drop of the bit line BLT1*a* in the cycle 2 and a potential drop of the bit line BLT1*a* in the cycle 3, which are shown in the timing diagram of FIG. 3.

As shown in FIG. 6, after the elapse of the predetermined period of time in the cycle 2, the sense signal SAE is switched from the "L" level to the "H" level to carry out the read operation. In this case, a voltage drop of the bit line BLT1*a* at a sense amplifier activation timing is represented by VSA1. Meanwhile, in the cycle 3, the load of the bit line pair BLT1*a* and BLB1*a* as well as the load of the bit line pair BLT1*b* and BLB1*b* is applied to the memory cell MC1.

Thus, if the sense amplifier is activated at the same timing, a voltage drop of the bit line BLT1*a* is represented by VSA2 which is smaller than VSA1. This causes a fear that FAIL is determined not due to the DNM deficiency but due to the sense margin deficiency. That is, the cause of the FAIL determination cannot be discriminated. For this reason, the noise addition is performed in the cycle 3 and the read operation (determination) is performed in the cycle 4, i.e., the noise addition and the determination are performed in different cycles.

Figure 7:
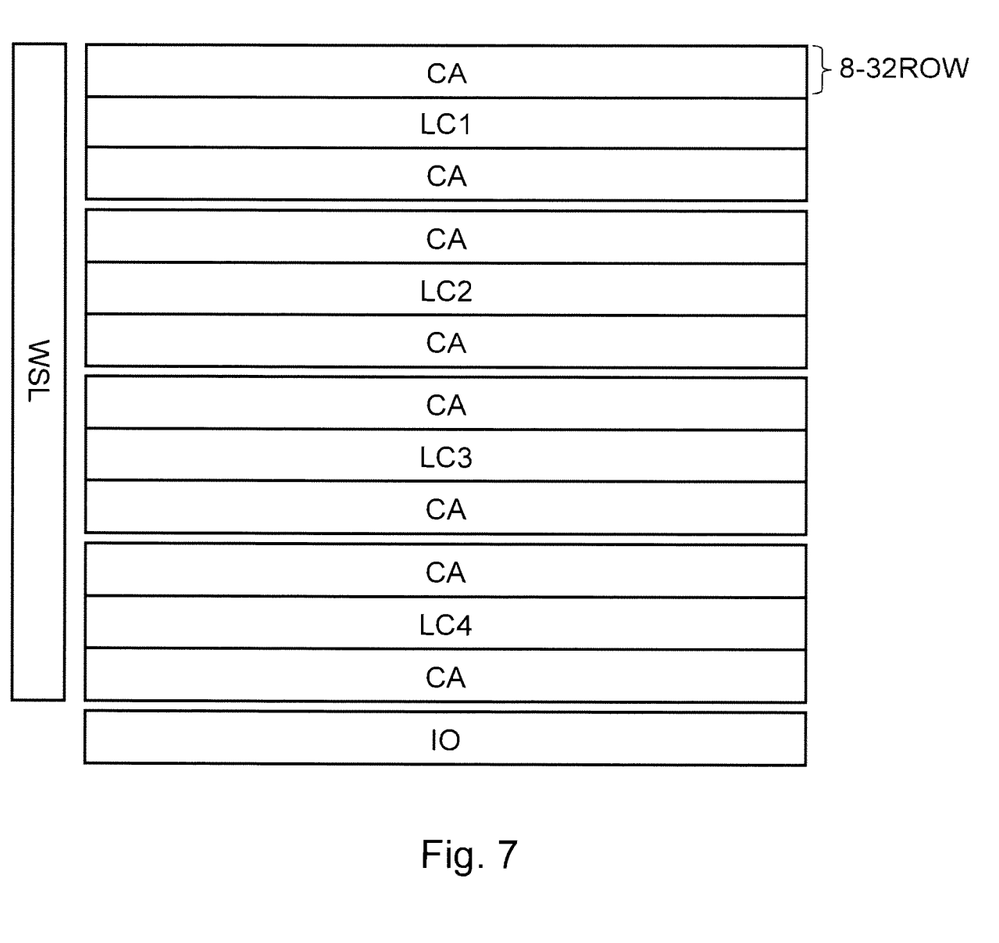
FIG. 7 is a layout diagram illustrating the semiconductor memory device according to the first exemplary embodiment.

FIG. 7 is a layout diagram of the semiconductor memory device according to the first exemplary embodiment. As described in detail with reference to FIG. 1, the cell arrays CA are formed on both sides of a local circuit LC1. Similarly, the cell arrays CA are formed on both sides of each of local circuits LC2 to LC4. The local circuits LC1 to LC4 are aligned substantially in parallel with each other and are arranged in a rectangular shape as a whole. Along one side of the rectangular shape, a word line sector WSL is disposed, and along another side adjacent to the one side of the rectangular shape, an input/output circuit 10 is disposed.

As shown in FIG. 7, the number of rows of cell arrays CA, i.e., "m" shown in FIG. 1 is preferably in the range from 8 to 32. As shown in FIG. 12, when the number of rows exceeds 32, the change in the DNM due to the increase in the bit line load, i.e., the number of rows becomes smaller, which makes it difficult to perform the DNM test according to this exemplary embodiment. Meanwhile, when the number of rows is smaller than 8, the occupied area of the local circuit LC becomes relatively large, which causes a problem of an increase in the size of the device.

As described above, another bit line pair is temporarily added as a load to the bit line pair, which is provided with the memory cells MC, thereby enabling the DNM test for the memory cells MC. In this case, the bit line pair which is temporarily added as a load is a bit line pair not for test but for normal memory. According to this exemplary embodiment, the operation margin can be appropriately evaluated using the DNM. Therefore, the productivity of high-speed SRAMs can be improved as compared with the evaluation using the conventional SNM.

[Second Exemplary Embodiment]

Figure 8:
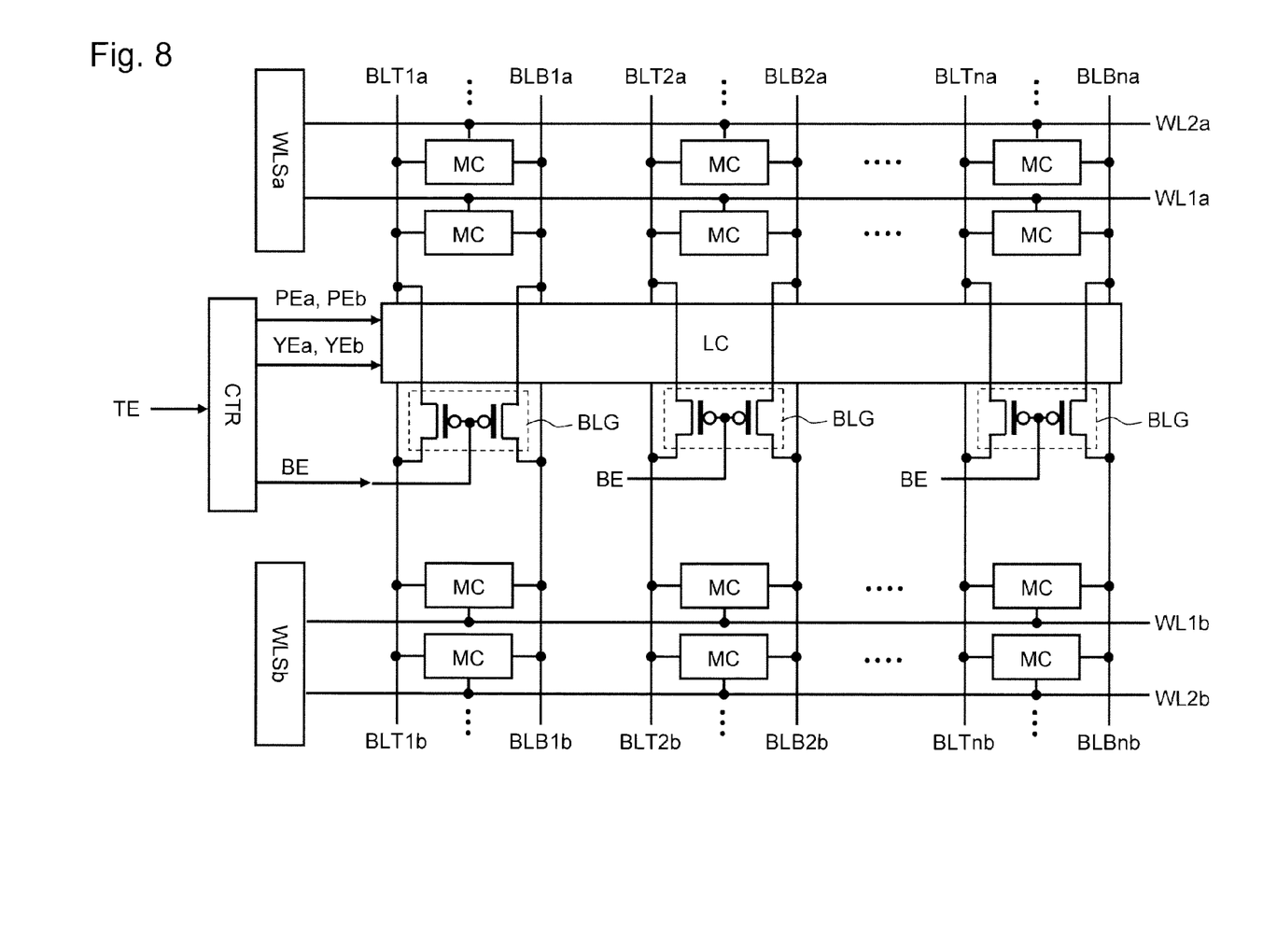
FIG. 8 is a circuit diagram illustrating a semiconductor memory device according to a second exemplary embodiment of the present invention.

Next, a second exemplary embodiment of the present invention will be described with reference to FIG. 8. FIG. 8 is a circuit diagram illustrating a semiconductor memory device according to the second exemplary embodiment. The semiconductor memory device shown in FIG. 8 differs from the semiconductor memory device shown in FIG. 1 in that bridge circuits BLG for connecting the bit line pairs which are opposed to each other through the local circuit LC are provided for each bit line pair. The other configurations are similar to those of the first exemplary embodiment, so the description thereof is omitted.

Specifically, the bit line pair BLT1*a* and BLB1*a* and the bit line pair BLT1*b* and BLB1*b* are connected through the bridge circuit BLG without involving the sense amplifier SA. That is, between the bit line pair BLT1*a* and BLB1*a* and the bit line pair BLT1*b* and BLB1*b*, the bridge circuit BLG and the sense amplifier SA are connected in parallel with each other. Similarly, a bit line pair BLT2*a* and BLB2*a* and the bit line pair BLT2*b* and BLB2*b* are connected through the bridge circuit BLG. The other bit line pairs have the same configuration.

Each bridge circuit BLG includes two PMOS transistors. The bridge circuit BLG which connects the bit line pair BLT1*a* and BLB1*a* and the bit line pair BLT1*b* and BLB1*b* will be described as a representative example. The gates of the two PMOS transistors receive a bridge signal BE output from the control circuit CTR. When the bridge signal BE is at the "L" level, both the PMOS transistors are turned on, and the bit line pair BLT1*a* and BLB1*a* and the bit line pair BLT1*b* and BLB1*b* are rendered conductive. Meanwhile, when the bridge signal BE is at the "H" level, both the PMOS transistors are turned off. The configuration of the bridge circuit BLG is not limited thereto, and a configuration similar to that of the Y selector, which is described in the first exemplary embodiment, may be employed, for example.

Figure 9:
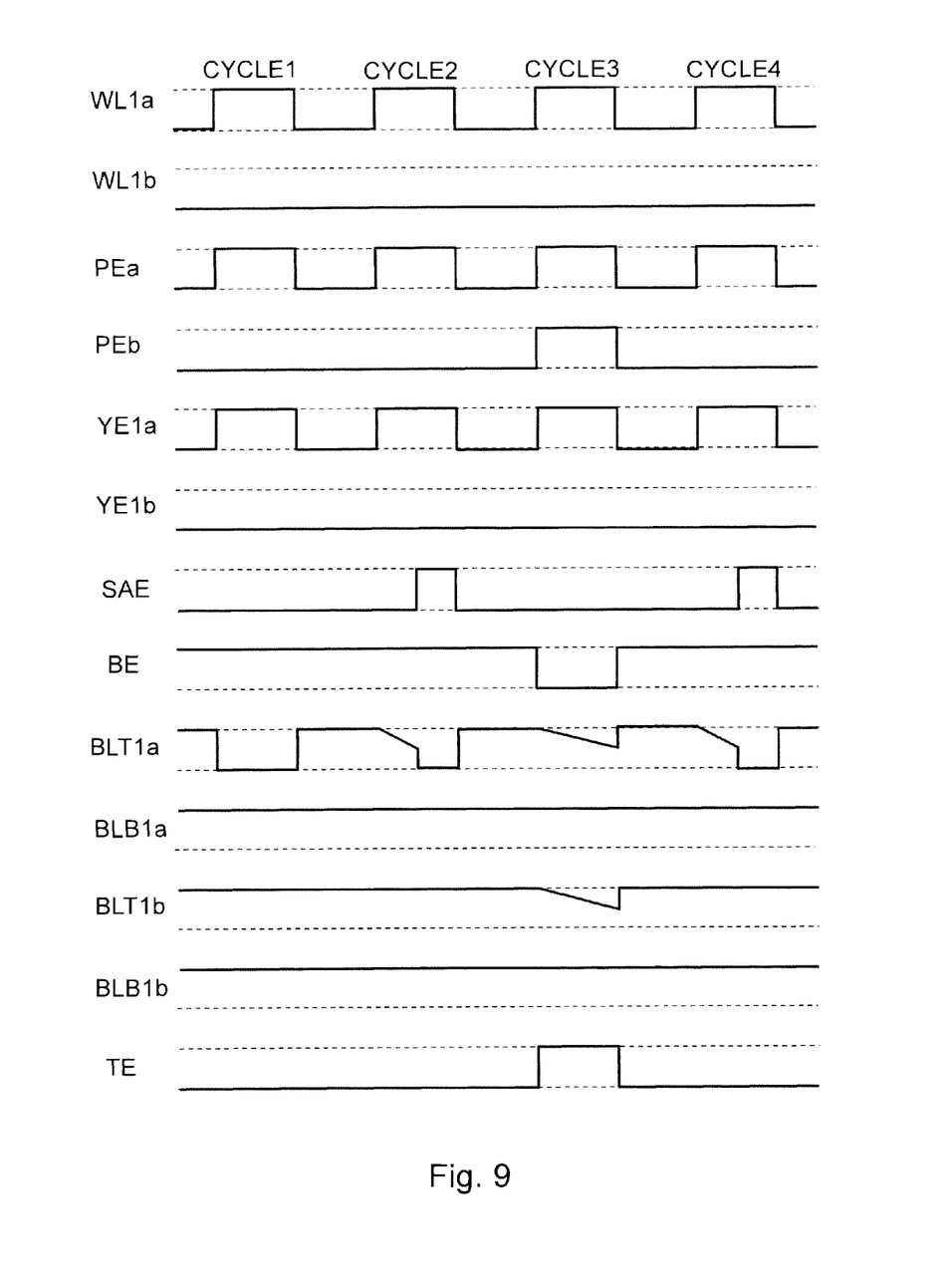
FIG. 9 is a timing diagram illustrating a test operation according to the second exemplary embodiment.

Referring next to FIG. 9, a test operation for the semiconductor memory device according to this exemplary embodiment will be described. FIG. 9 is a timing diagram illustrating the test operation according to the second exemplary embodiment. The cycles 1, 2, and 4 shown in FIG. 9 are similar to the cycles 1, 2, and 4 shown in FIG. 3 of the first exemplary embodiment, so the description thereof is omitted. The cycle 3 shown in FIG. 9 is described in comparison with the cycle 3 shown in FIG. 3. While the selection signal YE1*b* is at the "H" level in the cycle 3 shown in FIG. 3, the selection signal YE1*b* is maintained at the "L" level in the cycle 3 shown in FIG. 9. Meanwhile, in the cycle 3 shown in FIG. 9, the bridge signal BE for the bridge circuit BLG, which is additionally provided in this exemplary embodiment, changes from the "H" level to the "L" level only during this period. Accordingly, as in the first exemplary embodiment, the memory cell MC1 is also connected to the bit line pair BLT1*b* and BLB1*b*.

The use of the bridge circuit BLG makes it possible to perform the DNM test similar to that of the first exemplary embodiment, even in the case where the sense amplifier SA is not a shared sense amplifier.

[Third Exemplary Embodiment]

Figure 10:
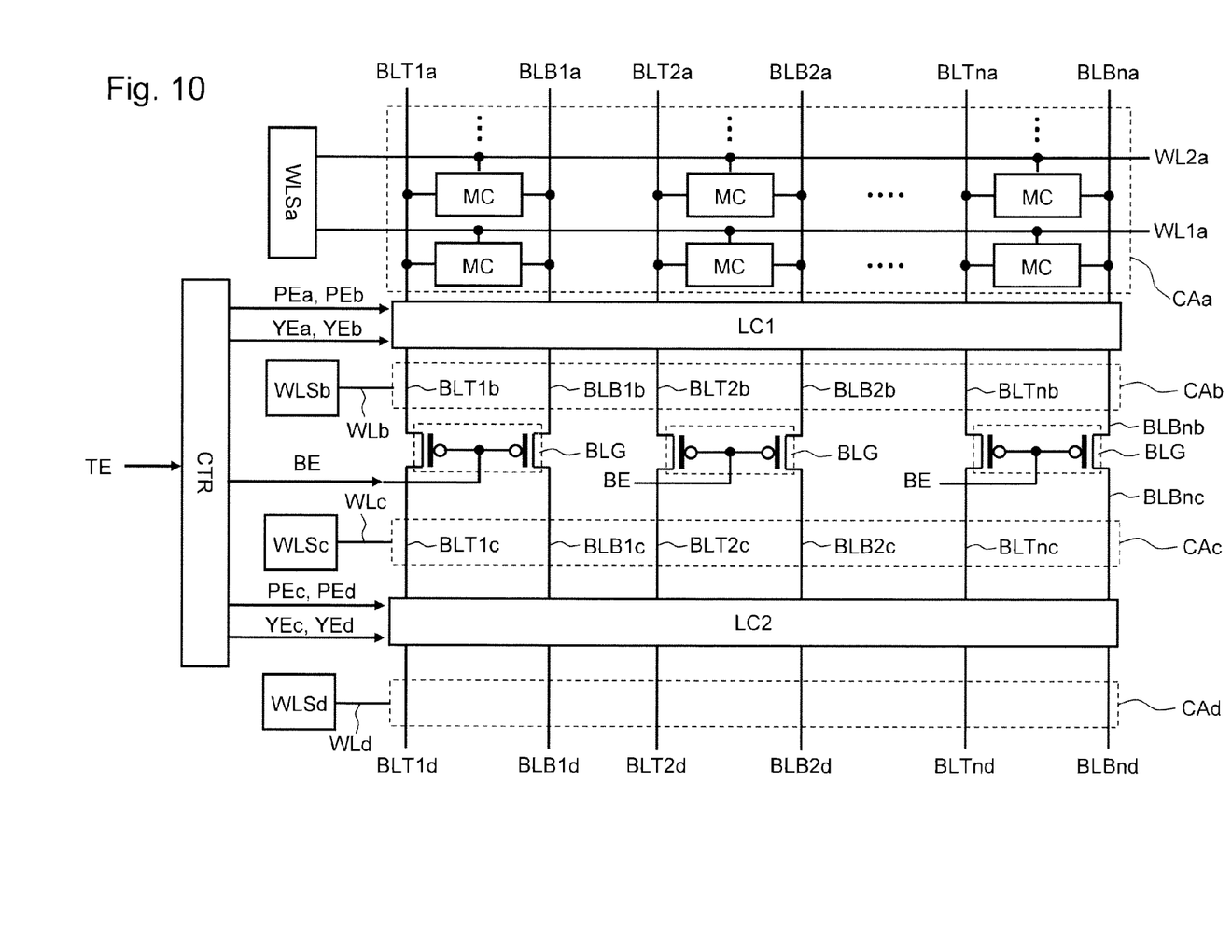
FIG. 10 is a circuit diagram illustrating a semiconductor memory device according to a third exemplary embodiment of the present invention.

Next, a third exemplary embodiment of the present invention will be described with reference to FIG. 10. FIG. 10 is a circuit diagram illustrating a semiconductor memory device according to the third exemplary embodiment. The semiconductor memory device shown in FIG. 10 includes two circuits shown in FIG. 1, and the two circuits are connected through the bridge circuits BLG.

On both sides of the local circuit LC1, cell arrays CAa and CAb are connected to each other. Similarly, on both sides of the local circuit LC2, cell arrays CAc and CAd are connected to each other. Additionally, word line selectors WLSb, WLSc, and WLSd are connected to the cell arrays CAb, CAc, and CAd through word lines WLb, WLc, WLd, respectively. Note that the word lines WLb, WLc, and WLd are each represented by one line for convenience of illustration. The detailed configurations of the local circuits LC1 and LC2 and the cell arrays CAa, CAb, CAc, and CAd are similar to those of FIG. 1.

The cell array CAb and the cell array CAc are connected through the bridge circuits BLG. Specifically, the bit line pair BLT1$b$ and BLB1$b$ and a bit line pair BLT1$c$ and BLB1$c$ are connected through the bridge circuit BLG. Similarly, the bit line pair BLT2$b$ and BLB2$b$ and a bit line pair BLT2$c$ and BLB2$c$ are connected through the bridge circuit BLG. The other bit line pairs have the same configuration.

Each bridge circuit BLG includes two PMOS transistors. The bridge circuit BLG which connects the bit line pair BLT and BLB1$b$ and the bit line pair BLT1$c$ and BLB1$c$ will be described as a representative example. The gates of the two PMOS transistors receive the bridge signal BE output from the control circuit CTR. When the bridge signal BE is at the "L" level, both the PMOS transistors are turned on, and the bit line pair BLT1$b$ and BLB1$b$ and the bit line pair BLT1$c$ and BLB1$c$ are rendered conductive. Meanwhile, when the bridge signal BE is at the "H" level, both the PMOS transistors are turned off. The configuration of the bridge circuit BLG is not limited thereto, and a configuration similar to that of the Y selector, which is described in the first exemplary embodiment, may be employed, for example.

Figure 11:
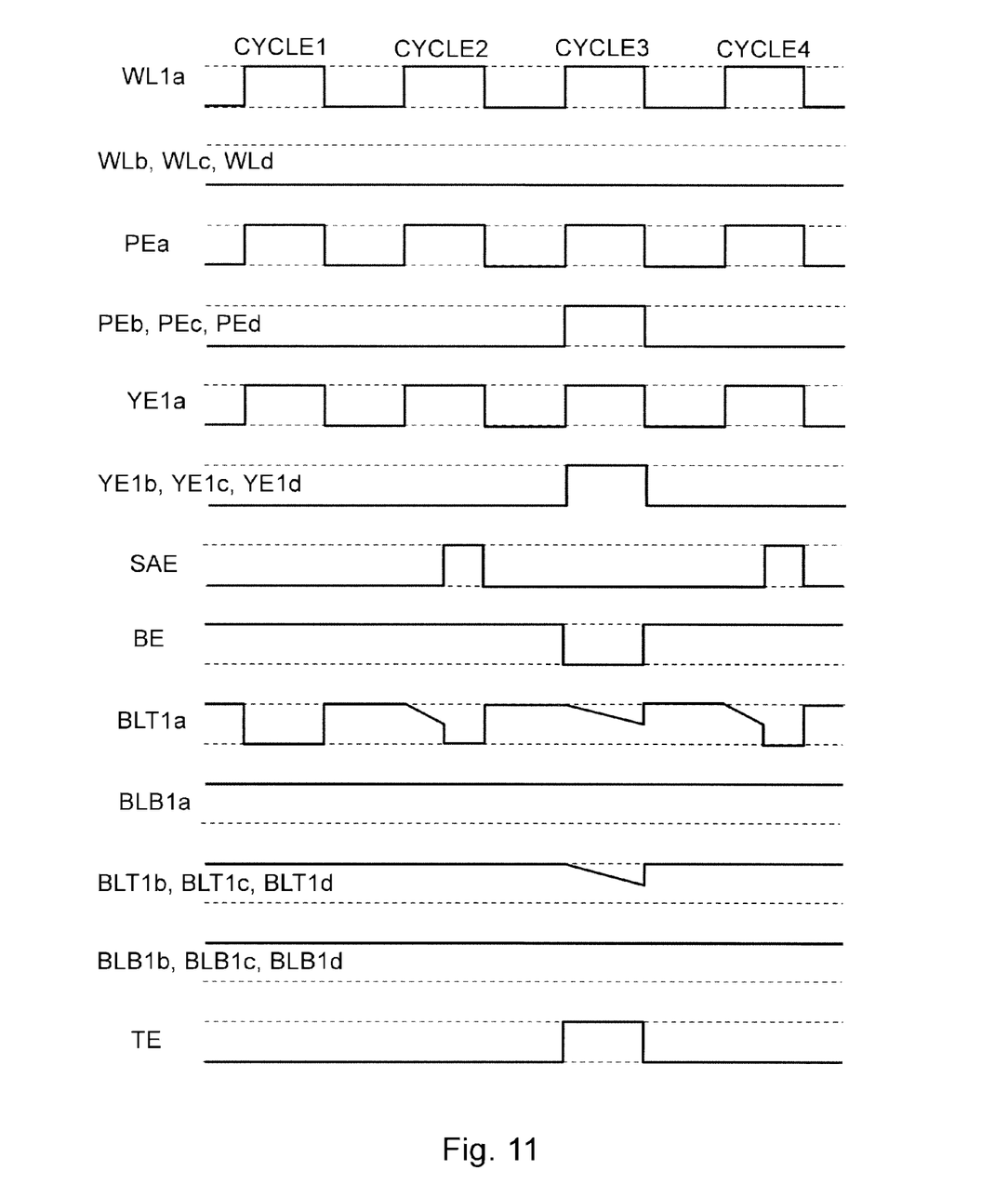
FIG. 11 is a timing diagram illustrating a test operation according to the third exemplary embodiment.

Referring next to FIG. 11, a test operation for the semiconductor memory device according to this exemplary embodiment will be described. FIG. 11 is a timing diagram illustrating the test operation. The cycles 1, 2, and 4 shown in FIG. 11 are similar to the cycles 1, 2, and 4 shown in FIG. 3 of the first exemplary embodiment, so the description thereof is omitted.

The cycle 3 shown in FIG. 11 is described in comparison with the cycle 3 shown in FIG. 3. In the cycle 3 shown in FIG. 3, the selection signal YE1$b$ is switch to the "H" level only during this period, whereas in the cycle 3 shown in FIG. 9, not only the selection signal YE1$b$ but also selection signals YE1$c$ and YE1$d$ are switched to the "H" level only during this period. Further, in the cycle 3 shown in FIG. 9, the bridge signal BE for the bridge circuit which is additionally provided in this exemplary embodiment, is switched from the "H" level to the "L" level only during this period. Accordingly, the memory cell MC1 is connected not only to the bit line pair BLT1$a$ and BLB1$a$ but also to the bit line pair BLT1$b$ and BLB1$b$, the bit line pair BLT1$c$ and BLB1$c$, and a bit line pair BLT and BLB1$d$. That is, a fourfold load is applied to the memory cell MC1.

Note that only during the period of the cycle 3, precharge signals PEb, PEc, and PEd become the "H" level, and the bit line pair BLT1$b$ and BLB1$b$, the bit line pair BLT1$c$ and BLB1$c$, and the bit line pair BLT1$d$ and BLB1$d$ are not precharged.

According to this exemplary embodiment, even in the case where the cell array CA has only one row (when n=1 in FIG. 1), a double or greater bit line load can be added to the memory cells MC.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor memory device comprising:
a first SRAM cell and a second SRAM cell:
a write circuit connected to a write enable signal,
a first bit line pair provided with the first SRAM cell;
a second bit line pair provided with the second SRAM cell;
a first sense amplifier provided with the first bit line pair;
a second sense amplifier provided with the second bit line pair;
a first switch circuit provided between the first bit line pair and the second bit line pair and connected to a first control signal different from the write enable signal; and
a controller configured to control the first switch circuit by the first control signal to render the first bit line pair and the second bit line pair conductive at a first timing, in a case of testing the first SRAM cell,
wherein the first switch circuit is provided between the first sense amplifier and the second sense amplifier.

2. The semiconductor memory device according to claim 1, further comprising:
a third SRAM cell;
a third bit line pair provided with the third SRAM cell; and
a second switch circuit provided between the first bit line pair and the third bit line pair,
wherein the first sense amplifier is provided between the first bit line pair and the third bit line pair.

3. The semiconductor memory device according to claim 2, wherein the second switch circuit comprises:
a first bit line selection circuit provided between the first sense amplifier and the first bit line pair; and
a second bit line selection circuit provided between the first sense amplifier and the third bit line pair.

4. The semiconductor memory device according to claim 2, wherein the first sense amplifier and the second switch circuit are connected in parallel with each other.

5. The semiconductor memory device according to claim 3, wherein the first bit
line pair and the third bit line pair are opposed to each other through the first sense amplifier.

6. The semiconductor memory device according to claim 4, wherein the first bit
line pair and the third bit line pair are opposed to each other through the first sense amplifier.

7. The semiconductor memory device according to claim 1, wherein the first switch circuit renders the first bit line pair and the second bit line pair conductive through neither the first sense amplifier nor the second sense amplifier, in a case of testing the first SRAM cell.

8. The semiconductor memory device according to claim 1, wherein the first bit line pair and the second bit line pair are provided between the first sense amplifier and the second sense amplifier.

9. A semiconductor memory device comprising:
a first SRAM cell and a second SRAM cell;
a write circuit connected to a write enable signal;
a first bit line pair provided with the first SRAM cell;
a second bit line pair provided with the second SRAM cell;

a first sense amplifier provided with the first bit line pair;
a second sense amplifier provided with the second bit line pair; and
a first switch circuit provided between the first bit line pair and the second bit line pair and connected to a first control signal different from the write enable signal,
wherein the first switch circuit renders the first bit line pair and the second bit line pair conductive at a first timing by the first control signal, in a case of testing the first SRAM cell,
wherein the first switch circuit is provided between the first sense amplifier and the second sense amplifier.

10. A semiconductor memory device comprising: a first SRAM cell and a second SRAM cell:
a first bit line pair provided with the first SRAM cell;
a second bit line pair provided with the second SRAM;
a first sense amplifier provided with the first bit line pair;
a second sense amplifier provided with the second bit line pair;
a first switch circuit provided between the first bit line pair and the second bit line pair; and
a controller that controls the first switch circuit to render the first bit line pair and the second bit line pair conductive at a first timing, in a case of testing the first SRAM cell,
wherein the first switch circuit is provided between the first sense amplifier and the second sense amplifier.

* * * * *